United States Patent
Camillus et al.

[11] Patent Number: 5,916,727
[45] Date of Patent: Jun. 29, 1999

[54] SELF-CONTAINED IMAGING ASSEMBLY

[75] Inventors: Joseph C. Camillus, Dayton; Mark A. Johnson, Chillicothe; John M. Taylor, Miamisburg, all of Ohio; Darrell A. Terry, Greenwood, S.C.; William Lippke; S. Thomas Brammer, both of Dayton, Ohio

[73] Assignee: Cycolor, Inc., Miamisburg, Ohio

[21] Appl. No.: 09/040,552

[22] Filed: Mar. 18, 1998

Related U.S. Application Data

[63] Continuation of application No. 08/570,658, Dec. 11, 1995, Pat. No. 5,783,353, which is a continuation-in-part of application No. 08/258,329, Jun. 10, 1994, abandoned.

[51] Int. Cl.⁶ .................................................. G03C 1/73
[52] U.S. Cl. .................. 430/138; 430/271.1; 430/273.1; 430/281.1; 430/288.1; 430/495.1; 430/533
[58] Field of Search ........................ 430/138, 273.1, 430/271.1, 281.1, 288.1, 495.1, 533

[56] References Cited

U.S. PATENT DOCUMENTS

| | | | |
|---|---|---|---|
| 3,672,935 | 6/1972 | Miller et al. | 117/36.8 |
| 3,732,120 | 5/1973 | Brockett et al. | 117/16 |
| 3,737,410 | 6/1973 | Mueller | 260/59 |
| 4,399,209 | 8/1983 | Sanders et al. | 430/138 |
| 4,413,048 | 11/1983 | Landa | 430/138 |
| 4,416,966 | 11/1983 | Sanders et al. | 430/138 |
| 4,440,846 | 4/1984 | Sanders et al. | 430/138 |
| 4,448,516 | 5/1984 | Arney et al. | 355/27 |
| 4,533,615 | 8/1985 | Arney et al. | 430/138 |
| 4,535,050 | 8/1985 | Adair et al. | 430/138 |
| 4,578,340 | 3/1986 | Saccocio et al. | 430/138 |
| 4,592,986 | 6/1986 | Nelson et al. | 430/98 |
| 4,662,282 | 5/1987 | Head et al. | 430/138 |
| 4,713,312 | 12/1987 | Adair et al. | 430/138 |
| 4,751,165 | 6/1988 | Rourke et al. | 430/138 |
| 4,766,050 | 8/1988 | Jerry | 430/138 |
| 4,772,530 | 9/1988 | Gottschalk et al. | 430/138 |
| 4,772,541 | 9/1988 | Gottschalk et al. | 430/339 |
| 4,816,846 | 3/1989 | Kollarits | 346/157 |
| 4,842,976 | 6/1989 | Sanders et al. | 430/138 |
| 4,865,942 | 9/1989 | Gottschalk et al. | 430/138 |
| 4,897,334 | 1/1990 | Matsumoto | 430/138 |
| 4,912,011 | 3/1990 | Yamamoto et al. | 430/138 |
| 4,935,820 | 6/1990 | Patel et al. | 358/302 |
| 4,962,010 | 10/1990 | Colyer et al. | 430/138 |
| 5,091,280 | 2/1992 | Yamaguchi et al. | 430/138 |
| 5,107,298 | 4/1992 | Higashiyama | 355/77 |
| 5,118,590 | 6/1992 | Kakimi | 430/138 |
| 5,128,773 | 7/1992 | Sato | 358/332 |
| 5,140,428 | 8/1992 | Park | 358/244 |
| 5,189,468 | 2/1993 | Sato et al. | 355/88 |
| 5,212,040 | 5/1993 | Sanders et al. | 430/126 |
| 5,223,960 | 6/1993 | Kim | 359/54 |
| 5,230,982 | 7/1993 | Davis et al. | 430/138 |
| 5,376,495 | 12/1994 | Washizu et al. | 430/138 |

FOREIGN PATENT DOCUMENTS

| | | | |
|---|---|---|---|
| 3923016 | 11/1990 | Germany | G03C 8/42 |
| 6463948 | 3/1989 | Japan | G03C 1/00 |

OTHER PUBLICATIONS

Higashiyama, JP 64–63948, English Translation, Mar. 9, 1989.

Nelson, Two Sheet Adhered Imaging System, Research Disclosure (1987), No. 276.

*Primary Examiner*—Bernard Codd
*Attorney, Agent, or Firm*—Thompson Hine & Flory LLP

[57] ABSTRACT

A sealed self-contained photohardenable imaging assembly comprising in order: a first transparent support; a subbing layer; an imaging layer comprising a developer material and a plurality of photohardenable microcapsules encapsulating a photohardenable composition and a color precursor wherein the imaging layer exhibits a residual stain of less than about 0.3 density units; an adhesive; and a second support which may be opaque or transparent, wherein the subbing layer is interposed between the first support and the imaging layer and the subbing layer includes a polymer having chemical moieties which bond to the microcapsules and the adhesive is interposed between the second support and the imaging layer.

13 Claims, 3 Drawing Sheets

SELF-CONTAINED IMAGING ASSEMBLY

CROSS-REFERENCE TO RELATED APPLICATIONS

This is a continuation of U.S. application Ser. No. 08/570,658, filed Dec. 11, 1995, now U.S. Pat. No. 5,783,353, which is a continuation-in-part of U.S. application Ser. No. 08/258,329, filed Jun. 10, 1994, now abandoned. U.S. application Ser. No. 08/570,658 is incorporated herein by reference.

BACKGROUND OF THE INVENTION

The present invention relates to a self-contained imaging assembly and, more particularly, to an improved self-contained imaging assembly in which a composition comprising photohardenable microcapsules and a developer material is disposed between a first transparent support and a second support which may be opaque or transparent to form a sealed assembly. The assembly is image-wise exposed to actinic radiation and subjected to an uniform rupturing force to provide an image in said composition which is visible against the second opaque support when viewed through the first transparent support or, if the second support is transparent, when the image is viewed as a transparency.

Photohardenable imaging systems employing microencapsulated radiation sensitive compositions are the subject of commonly assigned U.S. Pat. Nos. 4,399,209, 4,416,966 and 4,440,846. These imaging systems are characterized in that an imaging sheet including a layer of microcapsules containing a photohardenable composition in the internal phase is image-wise exposed to actinic radiation. In the most typical embodiments, the photohardenable composition is a photopolymerizable composition including a polyethylenically unsaturated compound and a photoinitiator and is encapsulated with a color former. Exposure to actinic radiation hardens the internal phase of the microcapsules. Following exposure, the imaging sheet is subjected to a uniform rupturing force by passing the sheet through the nip between a pair of pressure rollers.

Commonly assigned U.S. Pat. No. 4,440,846 discloses a self-contained imaging sheet in which the encapsulated color former and the developer material are co-deposited on one surface of a single substrate as one layer or as two contiguous layers. Upon image-wise exposing the imaging sheet and passing the sheet through pressure rollers, the microcapsules rupture and image-wise release the internal phase whereupon the color former migrates to the developer material where it reacts with the developer material and forms a colored image.

U.S. Pat. No. 4,766,050, commonly assigned, teaches an imaging system comprising a support, a layer containing microcapsules, a layer of developer material, and a layer containing an opacifying agent. The opacifying agent can form a separate layer or can be part of the layer containing the microcapsules or both but is interposed between the microcapsules and the developer to hide the microcapsules when viewing the image.

SUMMARY OF THE INVENTION

In the self-contained imaging system of the present invention, the developer and the photohardenable microcapsules are placed in the same imaging layer and the imaging layer is sealed between the two support members to form an integral unit. This sealed format is advantageous because it prevents the developer material and the chemicals in the microcapsules from contacting persons during handling and, depending on the nature of the supports, it also may prevent oxygen from permeating into the photohardenable material which may improve film speed and the stability of the image. The term "sealed" as used herein refers to a seal which is designed as a nontemporary seal which results in destruction of the imaging assembly if the seal is broken.

In the imaging assembly of the invention, the previously mentioned first support is transparent and the second support may be transparent or opaque. In the latter case, an image is provided against a white background as viewed through the transparent support and in the former case a transparency is provided in which the image is viewed as a transparency preferably using an overhead or slide projector. Sometimes herein the first support may be referred to as the "front" support and the second support may be referred to as the "back" support.

In order to insure that the imaging system is effectively sealed between the supports, a subbing layer is provided between one of the supports and the imaging layer and an adhesive is provided between the other support and the imaging layer. For optical clarity, the subbing layer will typically be located between the first support and the imaging layer. However, which support receives the subbing layer and which support receives the adhesive is a function of which support is coated with the wet imaging layer composition and which is assembled with the coated and dried imaging layer. The support which is coated with the imaging layer composition (which is typically the front support) will be provided with the subbing layer and the support which is assembled will receive the adhesive. In accordance with the preferred embodiment of the invention, the subbing layer is formed from a compound having chemical moieties such as hydroxy groups which will react with and bind to the microcapsules.

One of the most difficult technical hurdles in providing the sealed self contained assembly of the invention arises from the use of an imaging layer containing both the microcapsules and the developer. This format is desirable because the image is formed in direct contact with the front transparent support through which the image is viewed. It has been found that this provides better image quality than, for example, providing a developer layer which overlies a separate layer of microcapsules, because the assembly can be exposed and viewed from the same side, the image can be viewed against a white background (when the back support is opaque) and, the image lies directly under the support through which it is viewed where it is most intense. It will be readily appreciated that in using this format it is critical that the microcapsules exhibit little residual stain otherwise the background will appear discolored. Minimizing residual stain is difficult because in order to be sensitive to visible light the microcapsules must contain a photoinitiator which absorbs light and hence is colored. If the amount of the photoinitiator in the microcapsules is reduced to reduce undesirable background coloration, the film speed of the system is often reduced to such a level that the microcapsules cannot be fully cured without excessively long exposures. In accordance with a particular embodiment of the invention it has been found that an imaging layer containing microcapsules in admixture with the developer can be provided if the microcapsules contain a disulfide coinitiator as described in U.S. Pat. No. 5,230,982 which is incorporated herein by reference. Using this initiator system in the forgoing format enables one to reduce residual stain to less than 0.3 density units and preferably to less that 0.25 density units and yet maintain film speed.

Another problem encountered in blending microcapsules and developer in a single layer is that the two materials may not be compatible and may agglomerate. If there is an interaction between the developer and the microcapsules which results in agglomeration, the imaging layer can not be coated with the uniformity and continuity required in a photographic product. The difficulty here is that the microcapsules are prepared from emulsions which incorporate certain system modifiers or emulsifiers and the developers are also frequently obtained as emulsions which incorporate emulsifiers. If the two emulsifier systems are not compatible with each other, agglomeration results and high photographic quality cannot be obtained. In particular, the applicants have found that it is preferred to encapsulate photohardenable compositions containing acrylates in melamine formaldehyde microcapsules prepared using pectin as the system modifier. With these capsules, many developers cause agglomeration, but it has been found that phenolic resin developers characterized in that they are essentially free of water soluble acidic salts can be used with these capsules without agglomeration and with good photographic quality.

DETAILED DESCRIPTION OF THE INVENTION

Figure 1:
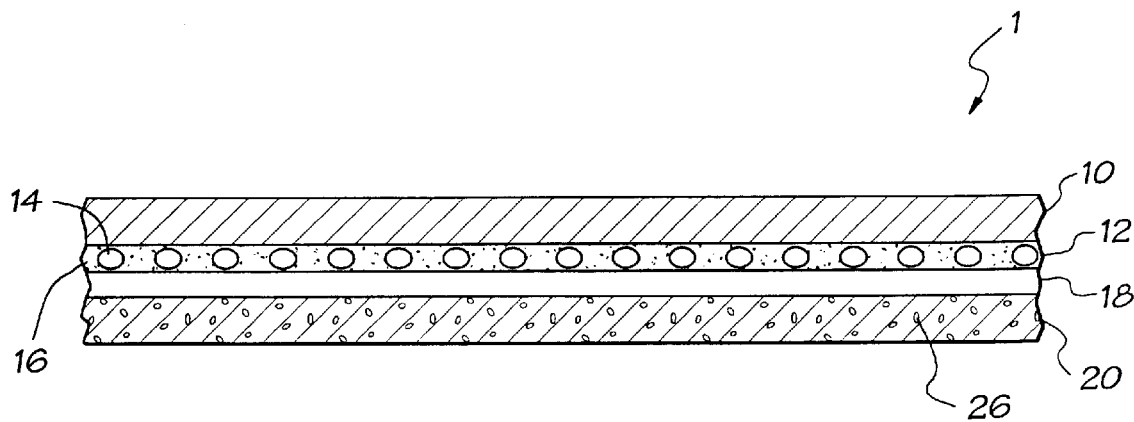
FIG. 1 is a cross-sectional view of an imaging system of the present invention.

As illustrated in FIG. 1 and in accordance with one embodiment of the present invention, a self-contained imaging system 1 comprises in order: a first transparent support 10, a subbing layer 11, an imaging composition 12 comprising photohardenable microcapsules 14 and a developer material 16, a layer of adhesive 18, and a second support 20 which may or may not contain an opacifying agent 26.

Images are formed in the present invention in the same manner as described in U.S. Pat. No. 4,440,846. By imagewise exposing this unit to actinic radiation, the microcapsules are differentially hardened in the exposed areas as taught in U.S. Pat. No. 4,440,846. The exposed unit is subjected to pressure to rupture the microcapsules.

Figure 2:
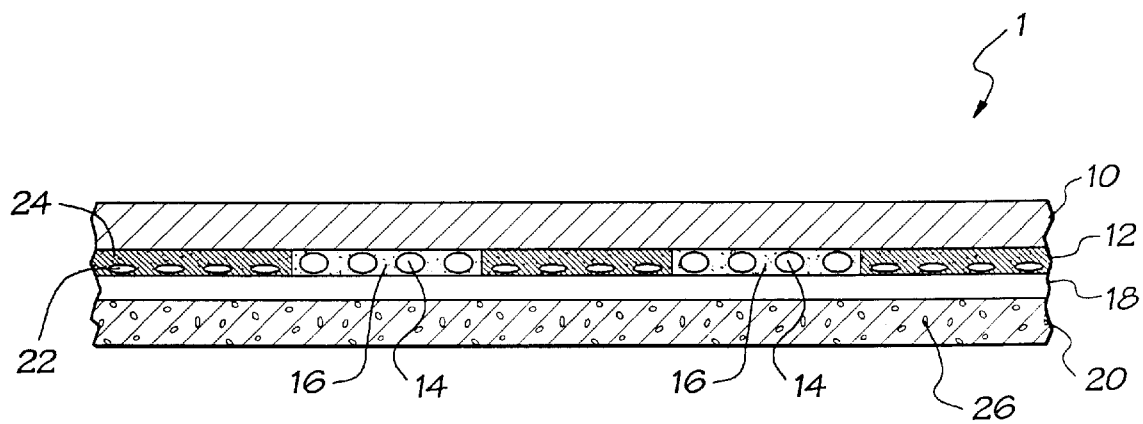
FIG. 2 is a cross-sectional view of FIG. 1 after exposure and microcapsule rupture.
Figure 3:
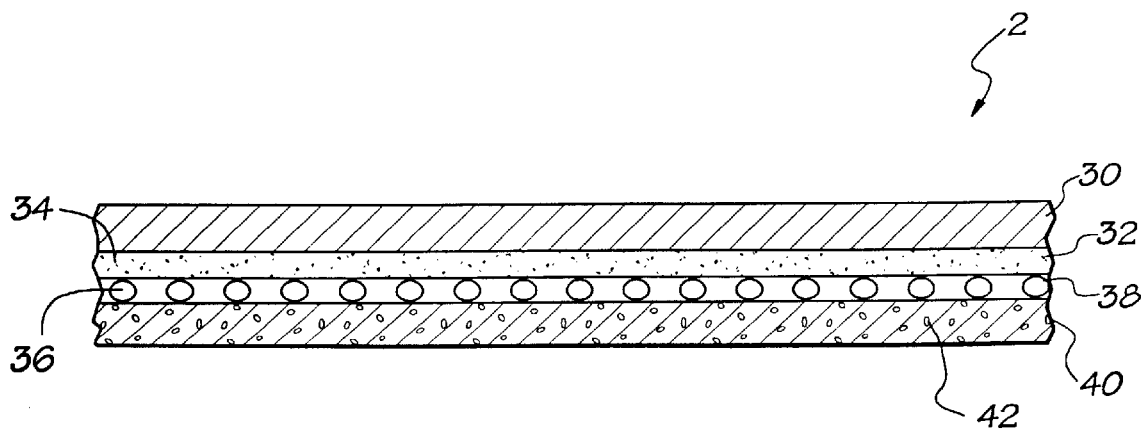
Figure 4:
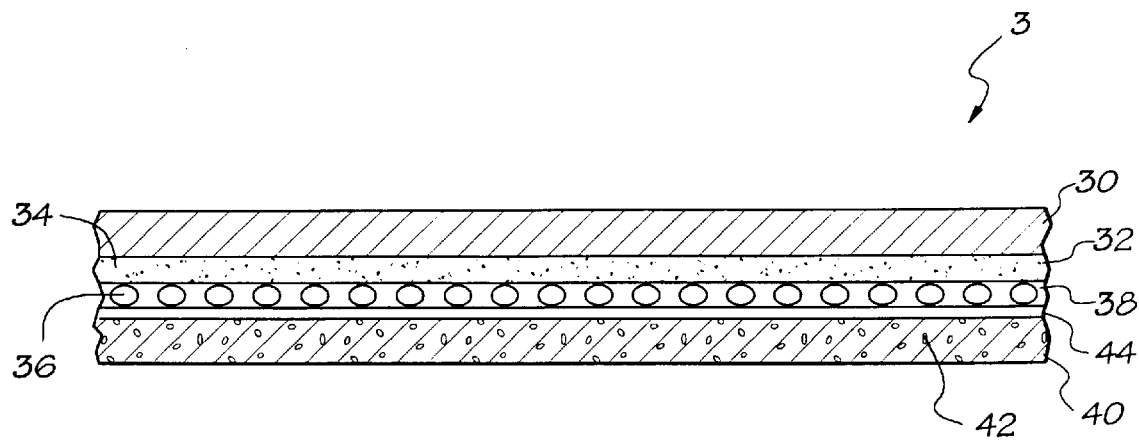
Figure 5:
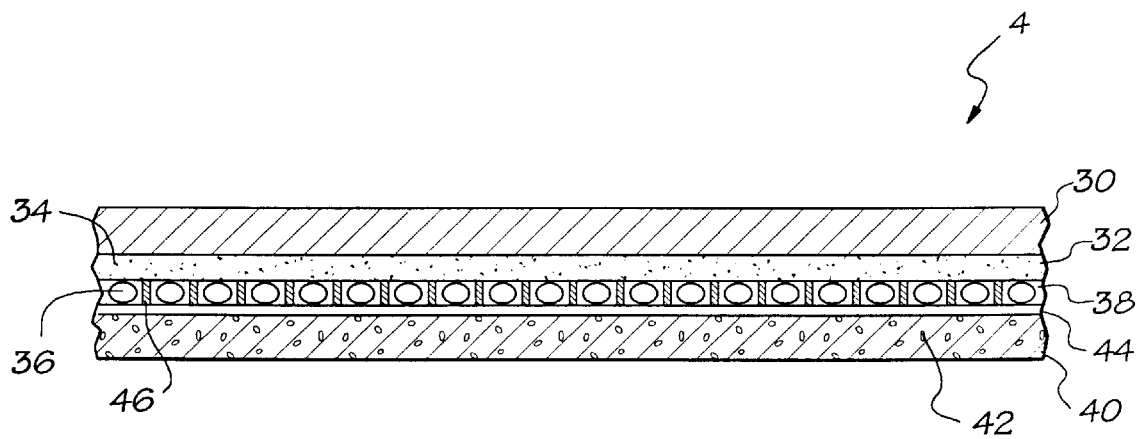
Figure 6:
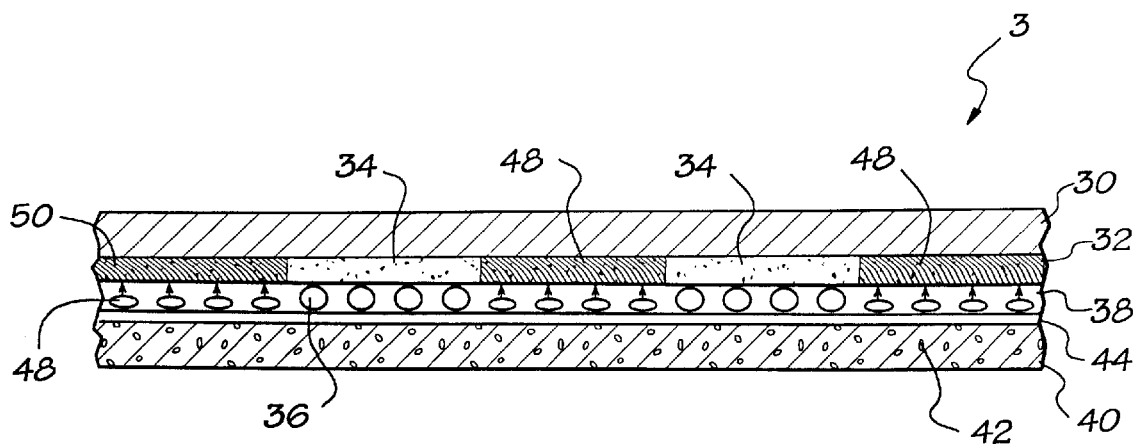
Figure 7:
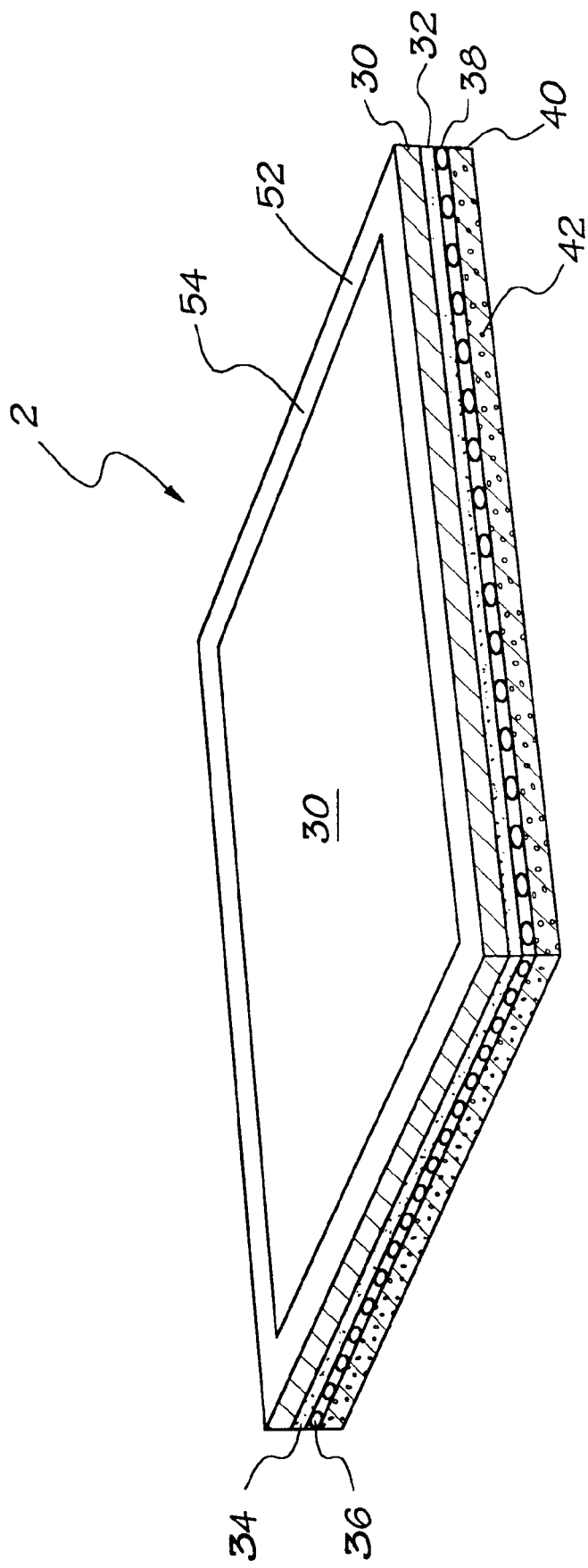

FIG. 2 illustrates the self-contained imaging system of FIG. 1 after exposure and rupture of the microcapsules 14. Ruptured microcapsules 22 release a color forming agent, whereupon the developer material 16 reacts with the color forming agent to form an image 24. The image formed is viewed through the transparent support 10 against the support 20 which can contain a white pigment. Typically, the microcapsules will consist of three sets of microcapsules sensitive respectively to red, green and blue light and containing cyan, magenta and yellow color formers, respectively, as taught in U.S. Pat. No. 4,772,541.

Imaging layer 12 typically contains about 20 to 80% (dry weight) of the developer, about 80 to 20% (dry weight) microcapsules and 0 to 20% of a binder. The layer is typically applied in a dry coat weight of about 8 to 20 g/cm$^2$. An example of such a coating formulation is illustrated in Example 1 below.

In the self-contained photohardenable imaging assembly as shown in FIG. 1, the first transparent support 10 through which the image is viewed can be formed from any transparent polymeric film. A film will be selected which provides good photographic quality when viewing the image. Preferably, a film will be used which is resistant to yellowing. The first support 10 is typically a transparent polyethylene terephthalate (PET) support.

The second support 20 is preferably an opaque support such as polyethylene terephthalate (PET) containing an opacifying agent, paper or paper lined with film (polyethylene, polypropylene, polyester, etc.). Most preferably the opaque support is a polyethylene terephthalate support containing about 10% titanium dioxide which provides a bright white. This support is commercially available from ICI, Ltd. under the product designation Melinex. Typically, each of the front and back PET supports has a thickness of about 2 to 4 mils.

Generally, the opaque support will be available commercially. Some other products which are useful include paper, cardboard, polyethylene, polyethylene-coated paper, etc. Opaque films are composites or admixtures of the polymer and the pigment in a single layer, films or coated papers. Alternatively, the opacifying agent can be provided in a separate layer underlying or overlying a polymer film such as PET. The opacifying agent employed in these materials is an inert, light-reflecting material which exhibits a white opaque background. Materials useful as the opacifying agent include inert, light-scattering white pigments such as titanium dioxide, magnesium carbonate or barium sulfate. In a preferred embodiment the opacifying agent is titanium dioxide.

In a preferred embodiment, the opaque second support is sufficiently opaque so that when a self-contained imaging sheet is exposed to radiation through the transparent support, the opaque support is effective to prevent the radiation from penetrating to other imaging sheets which may be stacked behind the imaging sheet during the exposure step. However, if the units are not exposed in a stacked format, the opacity of the support is not critical so long as the support provides the desired background. When both supports are transparent, if they are exposed in a stacked format, each self-contained imaging assembly must be separated from the other by an opaque member such as an opaque sheet or backing which is easily separated from the imaging sheet.

Adhesive materials useful in the layer 18 in the present invention can be selected from the general class of "modified acrylics" which have good adhesion, and which may be formulated with improved "tack" by addition of tackifying resins or other chemical additives. A useful adhesive must be designed for high initial adhesion and for adhesion to plastic substrates like polyester. It must have the ability to flow quickly for laminating to porous material (the imaging layer) and yet have inertness to the imaging layer. High strength adhesives specifically found useful in this invention are the film label stock adhesives of the 3M Company; preferred are 3M's #300 and #310 adhesive formulas which have shown good "inertness" to the imaging layer and its stability, and are useful when applied in the amount of about 0.5 to 2.0 g/m$^2$.

Other examples of adhesives useful in this invention may be aqueous-based adhesives such as Aerosett 2177 or Aerosett 2550 both of which are commercially available from Ashland Chemical Co., PD 0681, AP 6903, and W 3320 available from H. B. Fuller, or solvent-based adhesives such as PS 508 sold by Ashland Chemical Co. The adhesives may be used separately or in combination. Preferably, the adhesive is transparent or translucent and most preferably it is a transparent adhesive which remains clear even after subjecting the assembly to radiation and pressure necessary to image-wise expose and rupture the microcapsules. The amount of the adhesive will vary depending on the nature of the adhesive and the support. The adhesive is generally applied in an amount of about 0.5 to 20 g/m².

The peripheral edges of the self-contained assembly may be sealed additionally by any of the conventional means used to seal polymeric materials such as polyethylene terephthalate. For example, the edges of the films can be heat sealed together or they can be sealed by any other technique. In one embodiment, the PET is sealed using a heat sealing method such as a heat knife.

The subbing layer 11 must have good compatibility with the imaging layer, not causing image stability problems, and must remain clear and stable. It must allow the image view to be unobstructed; and during exposure the light must not be scattered. It must have good adhesion to the PET film. Amorphous polyesters have been found to work well as the subbing layer material. This water-dispersible polymer is well suited for this "adhesion, bonding, coating, priming" application. A polymer with molecular weight of 5,000–15,000, with a low hydroxyl number and low acid number, has been found to work well. A specific material of this type is the AQ polymers from Eastman Chemical and, more particularly, AQ38 and AQ55. The subbing layer is coated onto the clear PET at a low coat weight, 0.4–2.0 g/m², with a preferred amount of 0.8–1.2 g/m².

It has been found that the AQ polymers from Eastman Chemical Co. are particularly preferred. These polymers include hydroxy groups which are capable of interacting with melamine formaldehyde resin and it is believed that these hydroxy groups bind to the microcapsule walls and thereby provide a very secure bond between the support and the imaging layer.

One technique which is useful to improve media stability resides in conditioning the developer and microcapsule layer at a relative humidity of about 10 to 40% and preferably, about 20%. Most preferably, the layer is conditioned at about 20% R.H., for about 2 to 12 hours or more at ambient temperatures. Sealing of the assembly at low R.H. levels after conditioning assures that the layer is relatively moisture-free during the normal shelf-life of the assembly and this reduces the tendency for the developer layer and the microcapsule layer to remain in contact after development resulting in image darkening as described above.

Useful photohardenable compositions, photoinitiators, chromogenic materials, carrier oils and encapsulation techniques for the layer of microcapsules 14 are disclosed in U.S. Pat. No. 4,440,846 and 5,230,982 which are herein incorporated by reference. Preferred photohardenable compositions are described in commonly assigned U.S. Pat. No. 4,772,541, which is incorporated herein by reference. The aforesaid photohardenable compositions are non-silver systems. Also useful in the present invention is a silver-based photohardenable microencapsulated system such as that described in U.S. Pat. Nos. 4,912,011; 5,091,280 and 5,118,590 and other patents assigned to Fuji Photo Film Co.

In accordance with the preferred embodiments of the invention, a full color imaging system is provided in which the microcapsules are sensitive to red, green, and blue light respectively. The photohardenable composition in at least one and preferably all three sets of microcapsules is sensitized by a cationic dye-borate anion complex, e.g., a cyanine dye/borate complex as described in U.S. Pat. No. 4,772,541. Yellow, red and green sensitive cyanine borate initiators are shown in the examples. For optimum color balance, the microcapsules are sensitive (λ max) at about 450 nm, 540 nm, and 650 nm, respectively. Such a system is useful with visible light sources in direct transmission or reflection imaging. Such a material is useful in making contact prints or projected prints of color photographic slides. They are also useful in electronic imaging using lasers, light emitting diodes, liquid crystal displays or pencil light sources of appropriate wavelengths.

Because the cationic dye-borate anion complexes absorb at wavelengths greater than 400 nm, they are colored. The unreacted dye complex present in the microcapsules in the low density image areas can cause undesired coloration in the background area of the final picture. Typically, the mixture of microcapsules is green which gives the low density image areas a greenish tint. One approach to reducing undesired coloration in the low density image area as well as the developed image include reducing the amount of photoinitiator used and adjusting the relative amounts of cyan, magenta and yellow microcapsules as shown in the example which follow. Preferably, Dmin of the imaging layer is less than about 0.3 density units.

In accordance with a preferred embodiment of the invention, the photohardenable compositions used in the microcapsules contain a dye borate photoinitiator and a disulfide coinitiator. Examples of useful disulfides are described in U.S. Pat. No. 5,230,982 and are compounds of the formula (I)

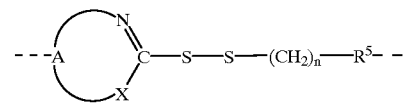

wherein X is selected from the group consisting of S and O except in a specific case in which the disulfide is derived from one or more tetrazolyl groups; n represents 0 or 1; A represents the residue of a ring containing the N, C and X atoms, the ring containing five or six members and, in addition, the ring members may be fused to an aromatic ring; and $R^5$ is an aromatic radical selected from the group consisting of (i) phenyl, (ii) benzothiazolyl, (iii) benzoxazolyl, (iv) tetrazolyl, (v) pyridinyl, (vi) pyrimidinyl, (vii) thiazolyl, (viii) oxazolyl, (ix) quinazolinyl, and (x) thiadiazolyl, each of which may have a substituent on one or more C or N atoms of the ring. Two of the most preferred disulfides are mercaptobenzothiazo-2-yl disulfide and 6-ethoxymercaptobenzothiazol-2-yl disulfide. By using these disulfides as described in the referenced patent, the amount of the photoinitiators used in the microcapsules can be reduced to levels such that the background coloration or residual stain is less than 0.3 and preferably less than 0.25 density units. At these low levels, the low density image area coloration of the imaging layer does not detract unacceptably from the quality of the image.

The photohardenable compositions of the present invention can be encapsulated in various wall formers using techniques known in the area of carbonless paper including coacervation, interfacial polymerization, polymerization of one or more monomers in an oil, as well as various melting, dispersing, and cooling methods. To achieve maximum sensitivities, it is important that an encapsulation technique be used which provides high quality capsules which are responsive to changes in the internal phase viscosity in terms of their ability to rupture. Because the borate tends to be acid sensitive, encapsulation procedures conducted at higher pH (e.g., greater than about 6) are preferred. Melamine-formaldehyde capsules are particularly useful. It is desirable in the present invention to provide a polyurea pre-wall in the preparation of the microcapsules. U.S. Pat. No. 4,962,010 discloses a particularly preferred encapsulation useful in the present invention in which the microcapsules are formed in the presence of pectin and sulfonated polystyrene as system modifiers. A capsule size should be selected which minimizes light attenuation. The mean diameter of the capsules used in this invention typically ranges from approximately 1 to 25 microns. As a general rule, image resolution improves as the capsule size decreases. Technically, however, the capsules can range in size from one or more microns up to the point where they become visible to the human eye.

The developer materials employed in carbonless paper technology are useful in the present invention. Illustrative examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts of aromatic carboxylic acids or derivatives thereof such as zinc salicylate, tin salicylate, zinc 2-hydroxy napththoate, zinc 3,5 di-tert butyl salicylate, zinc 3,5-di-(a-methylbenzyl) salicylate., oil soluble metals salts or phenol-formaldehyde novolak resins (e.g., see U.S. Pat. Nos. 3,672,935 and 3,732,120) such as zinc modified oil soluble phenol-formaldehyde resin as disclosed in U.S. Pat. No. 3,732,120, zinc carbonate etc. and mixtures thereof. The particle size of the developer material is important to obtain a high quality image. The developer particles should be in the range of about 0.2 to 3 microns and, preferably in the range of about 0.5 to 1.5 microns. A suitable binder such as polyethylene oxide, polyvinyl alcohol, polyacrylamide, acrylic latices, neoprene emulsions, polystyrene emulsions, and nitrile emulsions, etc. may be mixed with the developer and the microcapsules, typically in an amount of about 1 to 8% by weight, to prepare a coating composition.

A preferred developer material is one which has excellent compatibility with the microcapsule slurry solution. Many materials, including zinc salicylate and some phenolic resin preparations, have marginal or poor compatibility with the MF microcapsule preparation and result in agglomeration which is believed to be due to an incompatibility in the emulsifiers used in preparing the microcapsules and in the developer. The problem manifests itself in increasing solution viscosities or in instability of the microcapsules wall (or both). The microcapsules may become completely disrupted with a complete breakdown or disintegration of the wall. The problem is believed to be caused by the presence of water soluble acid salts in the developer solution. By modifying the acidic salts to make them water insoluble the developer material becomes compatible with the MF microcapsules. A preferred developer, which has good stability is Schenectady International resin HRJ-4250 solution.

Microcapsules useful in practicing the present invention are preferably prepared and blended to form a photohardenable layer as illustrated in Example 1 below. In accordance with the invention, the amount of photoinitiator in the microcapsules has been reduced and the ratio of cyan to magenta and yellow capsules has been adjusted to provide a layer with minimal residual stain so as not to detract from the image.

The imaging assembly sheets are packaged as a stack of sheets which go into a printing apparatus. A small, compact printer has been designed as most economical. A problem has been encountered with "picking" individual sheets from the stack of sheets and transporting these sheets into the "printing path" of the printer. Means to reduce this problem have included reducing/eliminating static (charged surfaces) in the sheets just prior to the final packaging; and secondly, a precision hinge on the printer film cassette or tray. With sheets having similar outer support surfaces, both being polyester, a printer mechanism design which picks only one sheet at a time has been difficult. If two or more sheets are picked up into the printing path the printer is jammed and must be disassembled by the user. A method to further aid the feeding of sheets into the printer is to add a "back coat" to the imaging assembly. This is preferably coated on the outer surface of the second support (which has the adhesive on the opposite side), typically the white support layer. This back coat material may be formulated to have some perceived aesthetic value (such as a writable or printable coating), but must have some difference relative to the adjacent next sheet surface which causes these surfaces not to adhere together. The preferred back coat material has a slight roughness to aid the "printer pickup roller" initiating the sheet movement into the printer. The most preferred material has a Sheffield Smoothness of 150–180 Sheffield units, such as a standard face matte coating on 3M label stock material. Other commercially available or known matte coatings can also be used. In general, these coatings include a binder and a grit or abrasive such as silica.

The present invention is illustrated in more detail by the following non-limiting example.

EXAMPLE 1

Model Laboratory Capsule Preparation

1. Into a 600 ml stainless steel beaker, 110 g water and 2.0 g. Versa TL502 (National Starch and Chemical Co.) sulfonated polystyrene (dry) are weighed.
2. The beaker is clamped in place on a hot plate under an overhead mixer. A six-bladed, 45° pitch, turbine impeller is used on the mixer.
3. After thoroughly mixing, 4.0 g pectin (polygalacturonic acid methyl ester) is slowly sifted into the beaker. This mixture is stirred for 2 hours at room temperature (800–1200 rpm).
4. The pH is adjusted to 6.0 with 2% sodium carbonate.
5. The mixer is turned up to 3000 rpm and the internal phase is added over a period of 10–15 seconds. Emulsification is continued for 10 minutes.
6. After 10 minutes, the mixing speed is reduced to 2000 rpm, the beaker is covered with foil and placed in a water bath to bring the temperature of the preparation to 65° C. A solution of melamine-formaldehyde prepolymer which is separately prepared by dispersing 3.9 g melamine in 44 g water, adding 6.5 g formaldehyde solution (37%) and heating at 60° C. until the solution clears plus 30 minutes is slowly added.
7. The pH is adjusted to 6.0. When 70° C. is reached, the hot plate is adjusted to maintain this temperature for a two hour cure time during which the capsule walls are formed.
8. After curing, mixing speed is reduced to 600 rpm, formaldehyde scavenger solution (2.5 g urea and 7.0 g water) is added and the solution was cured another 40 minutes.
9. The pH is adjusted to 9.5 using a 20% NaOH solution and stirred overnight at room temperature.

Three batches of microcapsules were prepared as above for use in a full color imaging sheet using the three internal phase compositions set forth below.

| | |
|---|---|
| TMPTA (trimethylolpropane triacrylate) | 50 g. |
| [2-(3-heptylbenzothiazole)][2-(1-heptyl-3,3'-dimethylindo)] cyanine triphenyl-n-butyl borate | 0.2 g. |
| 2,6-diisopropyl-n,n-dimethylaniline | 0.3 g. |
| 6-ethoxymercaptobenzothiazole-2-yl disulfide (EMBT-D) | 0.2 g. |
| Yellow color precursor (Reakt Yellow from BASF) | 5.0 g. |
| Desmodur N-100 polyisocyanate (Mobay) | 4.0 g. |

| | |
|---|---|
| TMPTA (trimethylolpropane triacrylate) | 50 g. |
| 1,1'-di-n-heptyl-3,3,3',3'-tetramethylindocarbocyanine-triphenyl-n-butyl borate | 0.2 g. |
| 2,6-Diisopropyl-n,n-dimethylaniline | 0.3 g. |
| 6-ethoxymercaptobenzothiazole-2-yl disulfide (EMBT-D) | 0.2 g. |
| Magenta color precursor (Copikem 35 from Hilton Davis) | 12 g. |
| Desmodur N-100 polyisocyanate (Mobay) | 4.0 g. |

| | |
|---|---|
| TMPTA (trimethylolpropane triacrylate) | 35 g. |
| DPHPA (Dipentaerythritol-pentaacrylate) | 15 g. |
| 1,1'-di-n-heptyl-3,3,3',3'-tetramethylindodicarbocyanine-triphenyl-n-butyl borate | 0.3 g. |
| 2,6-Diisopropyl-n,n-dimethylaniline | 0.3 g. |
| 6-ethoxymercaptobenzothiazole-2-yl disulfide (EMBT-D) | 0.2 g. |
| Cyan color precursor (Copikem 36 from Hilton Davis) | 5.0 g. |
| Desmodur N-100 polyisocyanate (Mobay) | 4.0 g. |

The following coating composition was prepared and coated on a PET support:

| | |
|---|---|
| Cyan Capsules | 36 g |
| Magenta Capsules | 30 g |
| Yellow Capsules | 34 g |
| Phenolic Resin (HRJ 4250 from Schenectady International) | 150 g |

A second PET support with 3M's #300 adhesive pre-coated thereon in an amount of about 1 g./m² to the coated composition.

The imaging assembly of the present invention can be exposed in any suitable camera or other exposure device to provide an image. The imaging assembly of this invention is especially suitable for exposure using a liquid crystal array or light emitting diodes driven by a computer generated signal or a video signal for the reproduction of images from a video cassette recorder, a camcorder, or the like.

Having described the invention in detail and by reference to preferred embodiments thereof, it will be apparent that modifications and variations are possible without departing from the scope of the invention defined in the appended claims.

What is claimed is:

1. A sealed self-contained photohardenable imaging assembly comprising in order:
   a first transparent support;
   a subbing layer;
   an imaging layer comprising a developer material and a plurality of photohardenable microcapsules encapsulating a photohardenable composition and a color precursor wherein the imaging layer exhibits a residual stain of less than about 0.3 density units;
   an adhesive; and
   a second support which may be opaque or transparent, wherein said subbing layer is interposed between said first support and said imaging layer and said subbing layer includes a polymer having chemical moieties which bond to said microcapsules and said adhesive is interposed between said second support and said imaging layer.

2. The assembly of claim 1 wherein said first transparent support is a clear polyethylene terephthalate film and said second support is an opaque polyethylene terephthalate film containing a white pigment.

3. The assembly of claim 2 wherein said pigment is titanium dioxide.

4. The assembly of claim 1 wherein said first transparent support is a clear polyethylene terephthalate film and said second support is a clear polyethylene terephthalate film.

5. The assembly of claim 1 wherein said chemical moieties are hydroxyl groups.

6. The assembly of claim 1 wherein said subbing layer is coated onto said first transparent support at a coat weight of about 0.4 to 2.0 g/m².

7. The assembly of claim 1 wherein said adhesive is a transparent adhesive.

8. The assembly of claim 1 wherein said microcapsules are melamine-formaldehyde microcapsules formed in the presence of pectin and said developer is a phenolic resin which is essentially free of water-soluble acid salts.

9. The assembly of claim 11 wherein said assembly further comprises a backing layer on the outer surface of said second support, wherein said backing layer improves the feedability of said imaging assembly in a printer.

10. The assembly of claim 1 wherein said photohardenable composition contains a disulfide having the formula:

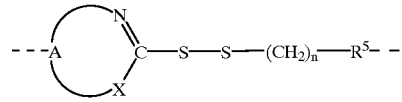

where x is selected from the group consisting of S and O; n represents 0 or 1; A represents the residue of the ring containing the N, C and X atoms, the ring containing five or six members and, in addition, said ring members may be fused to an aromatic ring; and $R^5$ is an aromatic radical selected from the group consisting of (i) phenyl, (ii) benzothiazolyl, (iii) benzoxazolyl, (iv) tetrazolyl, (v) pyridinyl, (vi) pyrimidinyl, (vii) thiazolyl, (viii) oxazolyl, (ix) quinazolinyl, and (x) thiadiazolyl each of which may have a substituent on one or more C or N atoms of the ring, wherein, the imaging layer exhibits a residual stain of less than about 0.3 density units.

11. The assembly of claim 10 wherein said disulfide is mercaptobenzothiazo-2-yl disulfide or 6-ethoxymercaptobenzothiazol-2-yl disulfide.

12. The assembly of claim 10 wherein said assembly exhibits residual stain less than 0.3 density units.

13. The assembly of claim 1 wherein said microcapsules are melamine-formaldehyde microcapsules.

* * * * *

UNITED STATES PATENT AND TRADEMARK OFFICE
CERTIFICATE OF CORRECTION

PATENT NO. : 5,916,727
DATED : June 29, 1999
INVENTOR(S) : Joseph C. Camillus, et al It is certified that error appears in the above-indentified patent and that said Letters Patent is hereby corrected as shown below:

Col. 10, line 30 (claim 9), "assembly of claim 11" should be -- assembly of claim 1 --.

Signed and Sealed this

Ninth Day of November, 1999

Attest:

Q. TODD DICKINSON

Attesting Officer

Acting Commissioner of Patents and Trademarks